United States Patent [19]
Walden

[11] 3,944,850
[45] Mar. 16, 1976

[54] CHARGE TRANSFER DELAY LINE FILTERS

[75] Inventor: Robert Henry Walden, New Providence, N.J.

[73] Assignee: Bell Telephone Laboratories, Incorporated, Murray Hill, N.J.

[22] Filed: July 31, 1975

[21] Appl. No.: 600,272

Related U.S. Application Data

[63] Continuation-in-part of Ser. No. 470,511, May 16, 1974, abandoned.

[52] U.S. Cl. ............... 307/221 D; 307/208; 307/295; 307/304; 328/167; 357/24
[51] Int. Cl.² H03H 11/00; H01L 27/10; H01L 29/78
[58] Field of Search ....... 307/208, 221 D, 295, 304; 328/167; 333/29; 357/24

[56] References Cited
UNITED STATES PATENTS

| | | | |
|---|---|---|---|
| 3,621,402 | 11/1971 | Gardner............................ | 328/167 |
| 3,740,591 | 6/1973 | Butler et al........................ | 307/295 |
| 3,777,186 | 12/1973 | Chang................................ | 357/24 |
| 3,789,267 | 1/1974 | Krambeck et al. .................. | 357/24 |
| 3,811,055 | 5/1974 | Weimer............................... | 357/24 |
| 3,819,959 | 6/1974 | Chang et al........................ | 357/24 |
| 3,824,413 | 7/1974 | Awipi et al. ....................... | 307/221 D |

OTHER PUBLICATIONS

Sequin, "Blooming Suppression . . .," Bell Syst. Tech. Journal, Oct. 1972, pp. 1923–1926.

Mok et al., "Logic Array . . . ", Electronics Letters, Oct. 5, 1972, Vol. 8, No. 20, pp. 495–496.

*Primary Examiner*—William D. Larkins
*Attorney, Agent, or Firm*—M. J. Urbano

[57] ABSTRACT

A charge transfer analog signal filter is described in which a plurality of charge storage cells are connected in series to form a delay line having a time delay T between its input and output cells. In a feed-forward rejection filter the analog signal is applied to the input cell through a cell of area $A_1$ and to the output cell through another cell of area $A_2$. The transfer function of the rejection filter is $$H(s) = \left( \frac{A_1}{A} e^{-sT} + \frac{A_2}{A} \right).$$

In a feedback bandpass filter the analog signal is applied to the input cell through a cell of area $A_1$, and the output cell is coupled to the input cell through the series combination of an analog inverter and another cell of area $A_2$. The transfer function of the bandpass filter is $$H(s) = \frac{A_1}{A} \left( \frac{A_2}{A} + e^{sT} \right)^{-1}.$$

7 Claims, 4 Drawing Figures

CHARGE TRANSFER DELAY LINE FILTERS

CROSS REFERENCE TO RELATED APPLICATIONS

This application is a continuation-in-part of parent application Ser. No. 470,511 filed on May 16, 1974 now abandoned. The parent application was filed concurrently with both application Ser. No. 470,546 entitled "Charge Transfer Logic Gate" and application Ser. No. 470,550 entitled "Charge Transfer Binary Counter". The latter application was abandoned in favor of continuation-in-part application Ser. No. 569,273 filed on Apr. 19, 1975.

BACKGROUND OF THE INVENTION

This invention relates to charge transfer devices and, more particularly, to charge coupled devices (CCDs) for performing signal filtering.

The recent emergence of charge coupled technology has brought with it the advent of shift register and memory devices now well known in the art. In order to fabricate complete systems, other circuit functions are frequently utilized. By way of illustration, such supplementary functions often include logical AND and OR, binary counting, and signal filtering. Advantageously, if all of the circuits performing the various functions of the system are charge coupled devices, the manufacture of the system is simplified. A shift register and an AND gate, for example, could be fabricated on a single chip by well known integrated circuit technology. Moreover, interface problems, such as impedance matching and loading due to stray capacitance, would be alleviated.

SUMMARY OF THE INVENTION

The invention is a charge transfer analog signal filter comprising illustratively a plurality of charge storage cells each of area $A$ connected in series with one another to form a delay line which provides a time delay $T$ between its input and output terminal cells.

Feedback or feed-forward means couple the terminal cells of the delay line to one another so that filtering of the analog signal occurs. In particular the analog signal to be filtered is applied to one terminal cell of the delay line through a charge storage cell of a first area and a delayed version of the signal is applied to the same terminal cell through another control charge storage cell of a different area.

In a feed-forward rejection filter the analog signal is applied to the input terminal cell of the delay line through a charge transfer cell of area $A_1$ and to the output terminal cell of the delay line through another charge transfer cell of area $A_2$. The transfer function of the rejection filter is given by $$H(s) = \left( \frac{A_2}{A} + \frac{A_1}{A} e^{-sT} \right).$$

The characteristic response of the rejection filter exhibits voltage minima at frequencies $f = n/2T$ where $n$ is an odd integer. On the other hand, in a feedback bandpass filter, the analog signal is applied to the input terminal cell of the delay line through charge storage cell of area $A_1$, and the output of the delay line is applied to the input terminal cell through the series combination of an analog inverter and another charge storage cell of the area $A_2$. The transfer function of the bandpass filter is given by $$H(s) = \frac{A_1}{A} \left( \frac{A_2}{A} + e^{sT} \right)^{-1}.$$

The characteristic response of the bandpass filter exhibits voltage maxima at frequencies $f = n/2T$ where $n$ is an odd integer.

BRIEF DESCRIPTION OF THE DRAWING

The invention, together with its various features and advantages, can be easily understood from the following more detailed description taken in conjunction with the accompanying drawing, in which.

DETAILED DESCRIPTION

Figure 1:
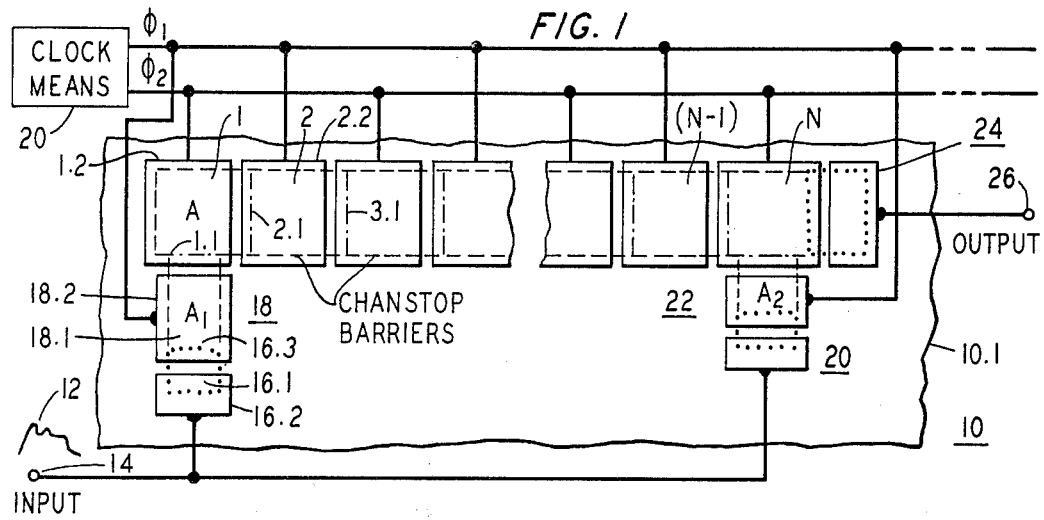
FIG. 1 is a plan view of a feed-forward rejection filter in accordance with an illustrative embodiment of the invention.

Turning now to FIG. 1, there is shown a plan view of a feed-forward rejection filter in accordance with an illustrative embodiment of the invention. The filter 10 comprises a storage medium 10.1, illustratively a $p^-$-type semiconductor substrate such as silicon on which is formed an insulative layer (not shown), typically thermally grown silicon dioxide. In the substrate are a plurality of rectangular charge storage cells, the boundaries of which are designated by dashed and dot-dashed lines. These boundaries, termed a barrier lattice, are illustratively established in the substrate by ion implantation or diffusion of stripes of immobile charge (i.e., impurity centers) in the fashion taught in U.S. Pat. No. 3,789,267 (Case 7–3) issued on Jan. 29, 1974 to R. H. Krambeck and myself.

The barrier lattice is composed of stripes of charge with two different potential heights: (1) chanstop barriers (dashed lines) which are designed to prevent charge transport across them. The object of chanstop barriers, as described in U.S. Pat. No. 3,728,161, issued on Apr. 17, 1973, is to eliminate spurious inversion of the surface of a semiconductor integrated circuit chip due to capacitive coupling between metallization and/or field oxide in the semiconductor substrate. If such coupling were strong enough to invert the surface of the semiconductor, current might leak between adjacent devices or might even short elements of a single device; and (2) transfer barriers (dot-dashed lines) which have a height typical of an $n$-channel device; ie., the application of most positive clock voltage to the barrier region should permit virtually complete transfer of charge. The transfer barriers are asymmetrically positioned with respect to the center of the overlaying electrode in order to cause charge to flow in a predictable direction. In addition, the boundaries of diffusion zones for diodes and the like are shown by dotted lines.

Returning now to the structural configuration shown in FIG. 1, it can be seen that the feed-forward rejection filter 10 comprises a delay line including a plurality of charge storage cells 1, 2 . . . N arranged in tandem or series relationship in storage medium 10.1. At the interface between each pair of adjacent cells is a transfer barrier (e.g., barrier 2.1 between cells 1 and 2). Overlaying each cell of the delay line is a field electrode asymmetrically positioned with respect to the underlying transfer barrier; e.g., electrode 2.2 overlays cell 2 and is positioned so that transfer barrier 2.1 is located near its lefthand edge, the edge nearer the input, so that charge will propagate from left to right (from input to output).

Charge propagation is under the control of clock means 20 which illustratively has two-voltage phases $\phi_1$ and $\phi_2$ with opposite phases connected to alternate ones of the delay line field electrodes. In general, the clock cycle frequency as well as the number of cells N in the delay line determine the time delay T from input to output of the delay line.

An analog signal 12 to be filtered is applied to input terminal 14 which is coupled to both of the delay line terminal cells; i.e., input cell 1 and output cell N. Coupling at both the input and output is made by means of the series combination of a diode and a charge storage cell. Thus, at the input the terminal 14 is connected to an electrode 16.2 which contacts an $n^+$ diode diffusion zone 16.1. As is well known in the art, electrical contact to the zone 16.1 is typically established by cutting a hole (not shown) in the insulative layer which overlays the $p^-$ semiconductor substrate so that the electrode 16.2 physically contacts zone 16.1 through the hole. Between the diode diffusion zone 16.1 and the input cell 1 of the delay line is another charge storage cell 18.1 having an area $A_1$. Overlaying cell 18.1 is a field electrode 18.2 connected to phase $\phi_1$ of clock means 20; i.e., to the opposite phase to which the field electrode 1.2 of the input cell 1 is connected. At the interface between cells 1 and 18.1 is a transfer barrier 1.1 which lies under electrode 1.2 in order to effect charge transfer from cell 18.1 to cell 1. For similar reasons, diode diffusion zone 16.1 also extends under field electrode 18.2; i.e., edge 16.3 of zone 16.1 lies under electrode 18.2.

In a similar fashion, input terminal 14 is coupled to output cell N of the delay line through a diode 20 and a charge storage cell 22, the latter having an area $A_2$. Cell 22 and cell N are connected to opposite phases of clock means 20, but cells 22 and 18 are connected to the same phase so that the analog input signal 12 is applied to the input cell 1 and the output cell N substantially simultaneously.

The output of the filter is illustratively taken from a diode 24 coupled to the output cell N. Components of the input signal which have frequencies in the "notches" of the filter response will not appear in the output signal at terminal 26. These notches, or voltage minima, are determined from the transfer function of the filter $$H(s) = \left( \frac{A_1}{A} e^{-sT} + \frac{A_2}{A} \right),$$

and occur at frequencies which are odd integrals of $\frac{1}{2}/2T$. As mentioned previously, T is a function of the clock frequency and the number of cells N in the delay line. However, the coefficient adjusters of the delayed and undelayed signals are determined by the relative areas of cells 18, 22 and 1 through N; i.e., by the ratios $A_1/A$ and $A_2/A$. In this regard cells $A_1$ and $A_2$ can be considered control cells in that they adjust the gain of the delayed and undelayed signals. Preferably, $A_1 + A_2 \leq A$ so that the delay line output cell N (of area A) has sufficient capacity to receive simultaneously charge transferred directly from cell 22 (of area $A_2$) and delayed charge transferred down the delay line from cell 18 (of area $A_1$).

Inasmuch as the time delay T is a function of the number N of cells in the delay line, one way to increase the delay T is to increase the number of cells N. However, design considerations, such as packing density, limit as a practical matter the number of such cells which can be arranged in a single line. This problem is alleviated by the more compact embodiment of the invention shown in FIG. 2 in which the delay line is folded to reduce its size. Thus, for purposes of illustration the delay line is shown as including four rows of charge storage cells (101–106, 107–112, 113–118 and 119–124). Each row has six cells each of area A. As before, the input signal is applied through cells 125 and 126 of area $A_1$ and $A_2$ to the input and output cells 101 and 124, respectively. The interface between adjacent rows (i.e., between adjacent cells in contiguous rows is a chanstop barrier, except at the "turn around" junctures of the delay line. These junctures are the interfaces between the last cells (106 and 107) of the first pair of rows, between the first cells (112 and 113) of the next pair of rows and so forth. Thus, the common interface between cells 106 and 107 is a transfer barrier 127. Similarly, the common interfaces between cells 112 and 113 and between cells 118 and 119 are also transfer barriers 128 and 129, respectively.

Figure 2:
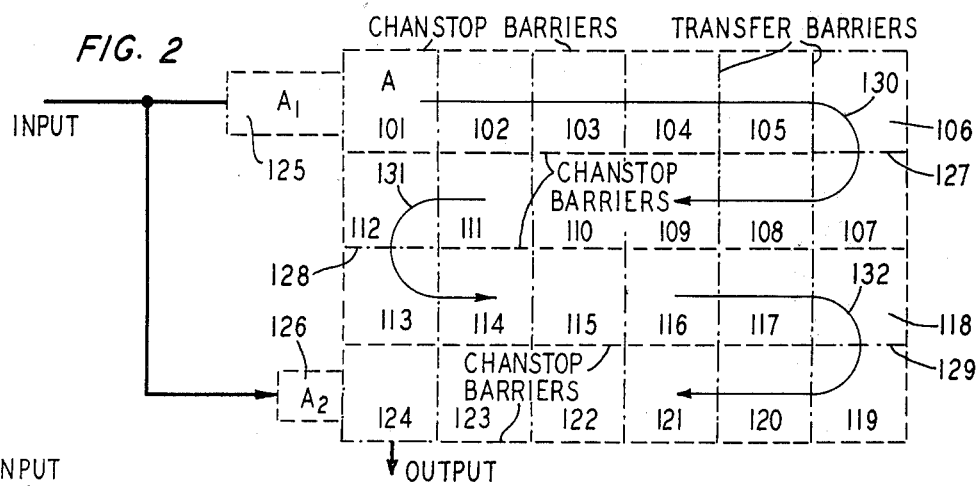
FIG. 2 is a schematic plan view of another feed-forward rejection filter in accordance with a second embodiment of the invention.

Not shown in FIG. 2 are the clock connections which are substantially identical to those of FIG. 1. The operation of this embodiment is also the same except that charge introduced at cell 125 propagates by two-phase clocking in the direction indicated by arrows 130, 131 and 132. Except for a different time delay, the filtering characteristics of the feed-forward rejection filter of FIG. 2 are also similar to those of FIG. 1.

Figure 3:
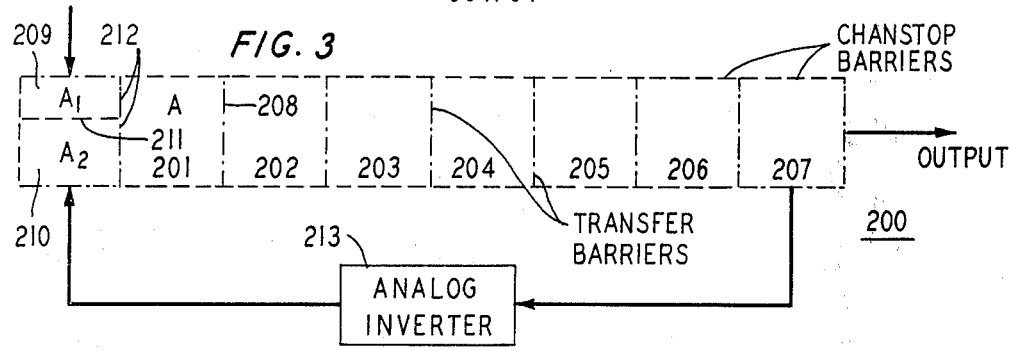
FIG. 3 is a schematic plan view of a feedback bandpass filter in accordance with a third embodiment of the invention.

In a similar fashion a feedback bandpass filter can be constructed in accordance with the principles of the invention. As schematically shown in FIG. 3, such a filter 200 comprises a delay line which includes, illustratively, seven charge storage cells 201 to 207 each of area A. The electrodes which overlay these cells and their connections to opposite phases of a two-phase clock have for simplicity been omitted. The interface between adjacent cells of the delay line is a transfer barrier (e.g., barrier 208 between cells 201 and 202). Adjacent the input cell 201 is a bifurcated cell identical in shape to the delay line cells but divided to form two adjacent rectangular subcells 209 and 210 of area $A_1$ and $A_2$, respectively. The common interface 211 between the subcells is a chanstop barrier whereas the interface 212 between the subcells and the input cell 201 is a transfer barrier.

Alternatively, cell 210 ($A_2$) may be positioned between inverter 213 and cell 207 and in charge transfer relationship to the latter. As before, the field electrodes (not shown) of the subcells are connected to the same phase of a clock, but to the opposite phase to which the input cell 201 is connected.

The signal to be filtered is applied to subcell 209 whereas the time delayed version of that signal appearing at output cell 207 is fed back through an analog inverter 213 to the subcell 210. The analog inverter 213 is preferably a CTD-device, illustratively of the type described by R. J. Strain and myself in copending application Ser. No. 353,629 filed on Apr. 23, 1973, now abandoned in favor of continuation-in-part application Ser. No. 512,848 filed on Oct. 7, 1974.

The output of the filter is illustratively taken from a diode (not shown) coupled to output cell 207. Components of the input signal which have frequencies within the pass bands of the filter response appear in the output signal. These pass bands, or voltage maxima, are determined from the transfer function of the filter $$H(s) = \frac{A_1}{A} \left( \frac{A_2}{A} + e^{sT} \right)^{-1}$$

and occur at frequencies which are odd integrals of $\frac{1}{2}/2T$. As mentioned previously, $T$ is a function of the clock frequency and the number of cells in the delay line. However, the coefficient adjusters of the delayed and undelayed signals are determined by the relative areas of the cells 201–207, 209 and 210; i.e., by the ratios $A_1/A$ and $A_2/A$. As before, cells $A_1$ and $A_2$ can be considered control cells.

Figure 4:
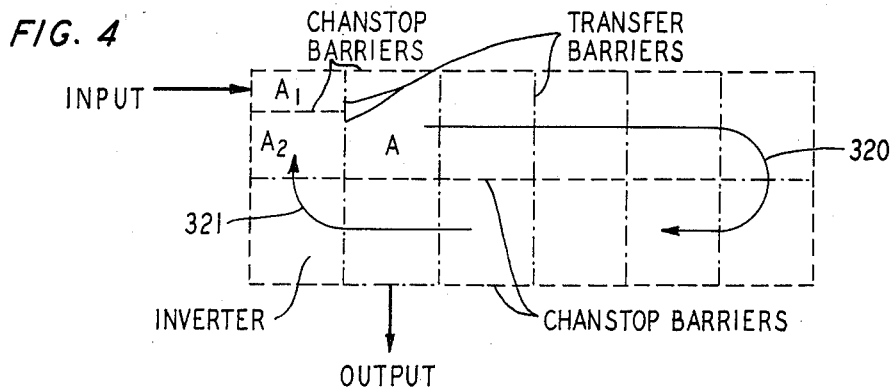
FIG. 4 is a schematic plan view of another feedback bandpass filter in accordance with a fourth embodiment of the invention.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the feedback bandpass filter of FIG. 3 can also be made more compact by folding the delay line as shown in FIG. 4. Charge is transferred in the directions indicated by arrows 320 and 321. Operation of the filter is otherwise identical to that described with reference to FIG. 3.

What is claimed is:

1. A charge transfer device for filtering an analog signal comprising,
    means including a charge storage medium for forming a delay line including a plurality of charge storage cells formed in said medium, said cells being connected in series with one another and each being of area A, a pair of terminal cells one of which forms the input and the other of which forms the output of said delay line,
    means forming in said medium charge storage control cells of areas $A_1$ and $A_2$, where $A_1$ is different from $A_2$, and
    means for applying said signal to one terminal cell through one of said charge storage control cells and for applying a delayed version of said signal through the other charge storage control cell to said one terminal cell.

2. The device of claim 1 having a transfer function given by $$H(s) = \left( \frac{A_2}{A} + \frac{A_1}{A} e^{-sT} \right)$$

and wherein said analog signal is applied to both of said control cells, alternate cells of said delay line are coupled to opposite phases of two-phase clock means and said control cells are coupled to the same phase of the clock means.

3. The device of claim 2 wherein said delay line comprises a plurality of rows of said charge storage cells, means forming chanstop barriers at the interface between adjacent rows except at the portion of said interfaces across which charge is to transfer from one row to the next contiguous row, means forming transfer barriers at said portions of said interfaces, said portions being located between the last cells of every other pair of contiguous rows and between the first cells of the remaining pairs of contiguous rows.

4. The device of claim 1 having a transfer function given by $$H(s) = \frac{A_1}{A} \left( \frac{A_2}{A} + e^{sT} \right)^{-1}$$

and including an analog inverter, said signal being applied to said control cell of area $A_1$, the time-delayed version of said signal appearing at said output terminal cell being applied to the input of said inverter and the output of said inverter being applied to said control cell of area $A_2$, and wherein alternate cells of said delay line are coupled to opposite phases of two-phase clock means and said control cells are coupled to the same phase of said clock means.

5. The device of claim 4 wherein said control cells are contiguous to one another and to said input terminal cell, and including means forming a chanstop barrier at the interface between said control cells and means forming a transfer barrier at the interfaces between said input cell and said control cells.

6. The device of claim 5 wherein the combined shape of said control cells is congruent with that of said input cell and $A_1 + A_2 = A$.

7. The device of claim 4 wherein said delay line comprises a plurality of rows of said charge storage cells, means forming chanstop barriers at the interfaces between adjacent rows except at the portion of said interfaces across which charge is to transfer from one row to the next contiguous row, means forming transfer barriers at said portions of said interfaces, said portions being located between the last cells of every other pair of contiguous rows and between the first cells of the remaining pairs of contiguous rows.

* * * * *

UNITED STATES PATENT AND TRADEMARK OFFICE
CERTIFICATE OF CORRECTION

PATENT NO. : 3,944,850
DATED : March 16, 1976
INVENTOR(S) : Robert H. Walden

It is certified that error appears in the above-identified patent and that said Letters Patent are hereby corrected as shown below:

Column 3, line 65, change "1/2/2T" to --1/2T--.

Column 5, line 19, change "1/2/2T" to --1/2T--.

Signed and Sealed this fifteenth Day of June 1976

[SEAL]

Attest:

RUTH C. MASON
*Attesting Officer*

C. MARSHALL DANN
*Commissioner of Patents and Trademarks*